United States Patent [19]
Rosbeck et al.

[11] Patent Number: 5,466,953
[45] Date of Patent: Nov. 14, 1995

[54] DENUDED ZONE FIELD EFFECT PHOTOCONDUCTIVE DETECTOR

[75] Inventors: Joseph P. Rosbeck, Santa Barbara; Charles A. Cockrum, Goleta, both of Calif.

[73] Assignee: Santa Barbara Research Center, Goleta, Calif.

[21] Appl. No.: 70,072

[22] Filed: May 28, 1993

[51] Int. Cl.⁶ .............................. H01L 27/14; H01L 31/00
[52] U.S. Cl. .......................... 257/185; 257/188; 257/191; 257/442
[58] Field of Search .................... 257/185, 188, 257/191, 441, 442, 657

[56] References Cited

U.S. PATENT DOCUMENTS

| | | | |
|---|---|---|---|
| 4,357,620 | 11/1982 | Wang et al. | 357/16 |
| 4,376,659 | 3/1983 | Castro | 148/1.5 |
| 4,494,133 | 1/1985 | Dean et al. | 257/188 |
| 4,885,619 | 12/1989 | Kosai | 357/24 |
| 4,914,495 | 4/1990 | Norton et al. | 357/30 |
| 4,956,304 | 9/1990 | Cockrum et al. | 437/5 |
| 4,961,098 | 10/1990 | Rosbeck et al. | 257/442 |
| 5,049,952 | 9/1991 | Huang et al. | 257/463 |
| 5,051,804 | 9/1991 | Morse et al. | 257/185 |
| 5,068,524 | 11/1991 | Elliott et al. | 257/188 |
| 5,079,610 | 1/1992 | Norton | 257/442 |
| 5,241,196 | 8/1993 | Huang et al. | 257/442 |

FOREIGN PATENT DOCUMENTS 2100927  1/1983  United Kingdom.

Primary Examiner—William Mintel
Assistant Examiner—Minhloan Tran
Attorney, Agent, or Firm—W. C. Schubert; W. K. Denson-Low

[57] ABSTRACT

A compositionally graded HgCdTe radiation detector (10) is constructed to have a high purity "denuded zone" (Region 2) that is formed adjacent to a radiation absorbing region (Region 1). The compositional grading results in an internally generated electric field that is orthogonally disposed with respect to an externally generated electric field applied between contacts (16, 18). The internally generated electric field has the effect of injecting photogenerated minority charge carriers into the denuded zone, thereby reducing recombination with photogenerated majority charge carriers and increasing carrier lifetime. The detector further includes a wider bandgap surface passivation region (Region 3) that functions to trap, or "getter", impurities from the denuded zone and also to reduce surface recombination effects.

18 Claims, 1 Drawing Sheet

5,466,953

DENUDED ZONE FIELD EFFECT PHOTOCONDUCTIVE DETECTOR

FIELD OF THE INVENTION

This invention relates generally to solid state radiation detectors and, in particular, to photoconductive radiation detectors that are sensitive to radiation within the infrared (IR) spectrum.

BACKGROUND OF THE INVENTION

A problem that is encountered in the use of conventional IR radiation detectors is a reduction in photocarrier lifetime due to the presence of impurities within the semiconductor material that comprises the active, radiation absorbing region. Of particular interest herein are radiation detectors that are constructed of Group II–VI semiconductor material, such as the material mercury-cadmium-telluride ($Hg_{1-x}Cd_xTe$), wherein x is a non-zero number less than one. The value of x is selected to achieve a desired bandgap of the Group II–VI material, which in turn determines a range of wavelengths that are absorbed by the material.

The impurities function as recombination sites wherein photogenerated charge carriers (electrons and holes) are effectively removed from the semiconductor material. This results in a reduction-in both responsivity and detectivity.

It is known in the art to provide a wider bandgap semiconductor material at a surface of semiconductor material radiation absorbing layer, the wider bandgap surface material functioning as a passivation layer to reduce surface noise states. For example, reference is made to the following two commonly assigned U.S. Patents for showing photovoltaic IR radiation detectors that include a wider bandgap layer that overlies a radiation absorbing HgCdTe layer: U.S. Pat. No. 4,956,304, "Buried Junction Infrared Photodetector Process", to C. A. Cockrum, J. B. Barton, and E. F. Schulte; and U.S. Pat. No. 4,961,098, "Heterojunction Photodiode Array", to J. P. Rosbeck and C. A. Cockrum. This latter U.S. Patent also shows the use of a compositionally graded radiation absorbing layer and a compositionally graded, wider bandgap cap layer.

Commonly assigned U.S. Pat. No. 5,079,610, "Structure and Method of Fabricating a Trapping Mode", to P. R. Norton shows the use of a wider bandgap p-type layer for trapping minority carrier holes. A p-n junction is employed in this device for separating carriers. Commonly assigned U.S. Pat. No. 4,914,495, "Photodetector with P Layer Covered by N Layer", to P. R. Norton, M. Moroz, and C. S. Talley shows the use of an n-type layer that substantially completely overlies a p-type layer. The p-type layer is employed for trapping minority carriers holes.

Commonly assigned U.S. Pat. No. 4,885,619, "HgCdTe MIS Device Having a CdTe Heterojunction", to K. Kosai describes a metal-insulator-semiconductor (MIS) device that includes a HgCdTe substrate having a CdTe passivation layer.

Also of interest are U.S. Pat. No. 4,357,620 for showing a Liquid Phase Epitaxy (LPE) process that grows a HgCdTe epilayer on a CdTe substrate, and a CdTe epilayer upon the HgCdTe epilayer; U.S. Pat. No. 4,376,659 for showing a narrow-gap semiconductor layer that is deposited upon a wider-gap semiconductor layer; and U.K. Patent Application No. GB 2 100 927 for showing a photodiode having a HgCdTe substrate and a CdTe layer, wherein heating causes diffusion between the HgCdTe and CdTe to provide a graded heterostructure.

What is not provided in radiation detectors of the prior art, and what are thus objects of this invention to provide, are (a) a radiation detector having a "denuded zone" of semiconductor material of high purity; (b) a radiation detector having a compositionally graded radiation absorbing region that generates an electric field for injecting minority photocarriers into the denuded zone; and (c) a radiation detector having a graded composition passivation layer to both getter impurities and reduce surface recombination effects.

SUMMARY OF THE INVENTION

The foregoing and other problems are overcome and the objects of the invention are realized by a compositionally graded HgCdTe radiation detector that is constructed to have a high purity "denuded zone" that is formed adjacent to a radiation absorbing region. The compositional grading results in an internally generated electric field that is orthogonally disposed with respect to an externally generated electric field that results from a bias potential applied between first and second electrical contacts. The internally generated electric field has the effect of injecting photogenerated minority charge carriers into the denuded zone, thereby reducing recombination with photogenerated majority charge carriers and increasing minority carrier lifetime. The detector further includes a wider bandgap surface passivation region that functions to immobilize, or "getter" impurities from the denuded zone, and also to reduce surface recombination effects.

The combination of these features provides an IR radiation detector having improved performance at low temperatures (below 150K). The detector constructed in accordance with this invention furthermore has advantages for very long wavelength IR (VLWIR) applications ($\lambda > 12$ micrometers), and enables detectors to be manufactured with enhanced repeatability.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
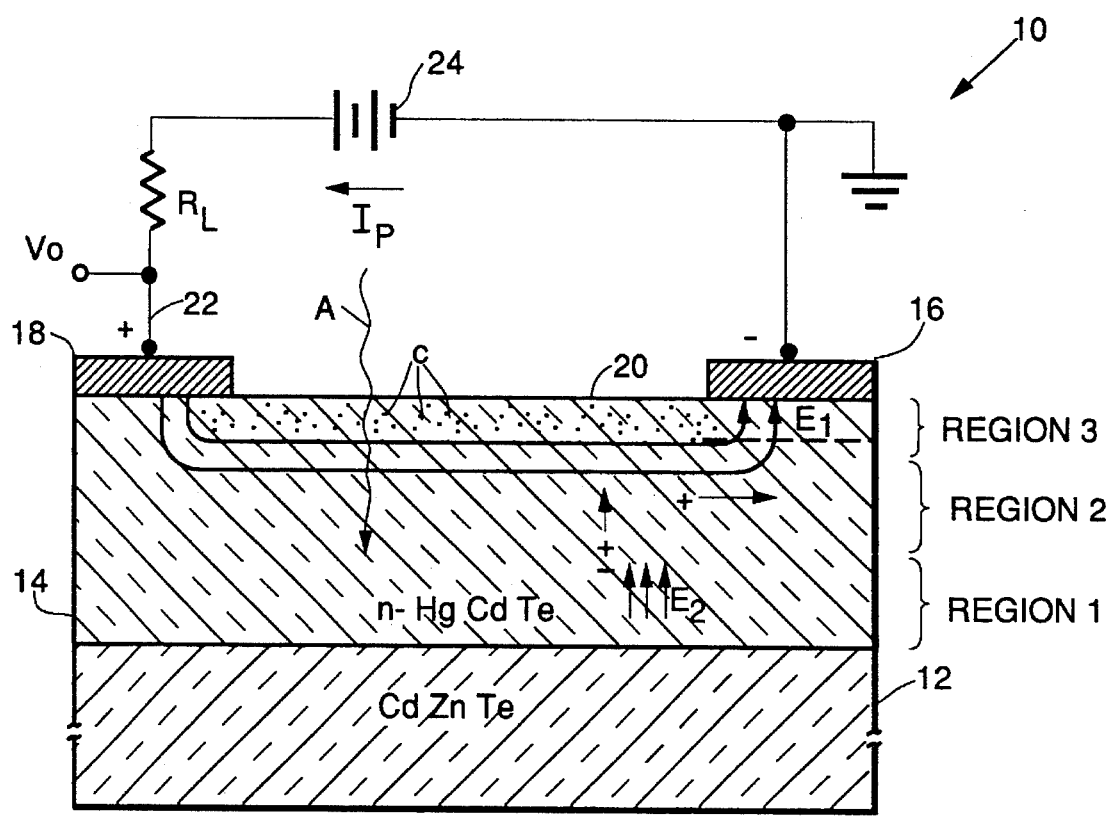
FIG. 1 is a cross-sectional view, not to scale, of a photoconductive radiation detector that is fabricated in accordance with this invention.

Referring to FIG. 1 there is illustrated a front-side illuminated photoconductive radiation detector 10 that is constructed and operated in accordance with this invention. Detector 10 includes a Group II–VI substrate 12 comprised of, by example, CdZnTe. The substrate 12 has a suitable thickness, such as 0.75 mm, for providing mechanical support for an overlying epitaxial layer (epilayer) 14 that is comprised of HgCdTe. The epilayer 14 is differentiated during layer growth into three operationally distinquishable regions. The regions are referred to herein as Region 1, Region 2, and Region 3. Overlying surfaces of the epilayer 14 are first and second contacts 16 and 18. During use, contacts 16 and 18 are coupled through electrical interconnects 22 to a source of bias potential, shown schematically as a battery 24. The magnitude of an output signal voltage $V_o$ is a function of a magnitude of incident radiation, shown as A, that is absorbed within the Region 1. The absorption of the incident radiation results in the generation of majority and minority photocarriers which cause the detector's resistance to decrease and, in turn, result in an increase in $I_p$ and hence an increase in $V_o$.

As was noted above, the epilayer 14 is differentiated into three regions. Region 1 is comprised of n-type HgCdTe having a thickness of approximately 7 to 10 micrometers. In accordance with an aspect of this invention the n-type HgCdTe material is compositionally graded from a wider bandgap to a narrower bandgap, with the wider bandgap material being adjacent to the substrate 12. By example, the composition of the n-type HgCdTe material that is adjacent to the surface of the substrate 12 is $Hg_{1-0.27}Cd_{0.27}Te$, and the composition at the interface between Region 2 and Region 3 is $Hg_{1-0.22}Cd_{0.22}Te$. Region 1 may be lightly doped with In ($N_D \leq 1\times10^{15}$ cm$^{-3}$) or undoped.

Adjacent to the n-type portion of the Region 1 is the Region 2, which is referred to herein as a denuded zone. That is, Region 2 is comprised of HgCdTe that is only lightly doped ($<2\times10^{15}$ atoms/cm$^3$), or not intentionally doped, and that has a minimal amount of impurities contained therein. A suitable thickness for the Region 2 is approximately 3 micrometers. It is noted that the compositional grading of the Region 1 extends through the Region 2 to the interface between the Region 2 and the Region 3.

In accordance with an aspect of this invention the compositional grading of the Region 1 results in the generation of an intrinsic electric field ($E_2$) that is orthogonally disposed with respect to the electric field ($E_1$) that is established between the contacts 16 and 18 by the bias potential provided by battery 24. $E_2$ typically has a greater magnitude than $E_1$ for typical values of bias potential. During operation, $E_1$ causes minority photocarriers, or holes in this example, to move in a direction parallel to $E_1$ and to the negative potential on the contact 16. The presence of $E_2$ also acts to move minority photocarriers (or holes in this example) in a direction towards the denuded zone of Region 2. This results in an injection of minority carriers into the denuded zone of Region 2, and the effective removal of the minority carriers from the n-type portion of Region 1. This further results in an increase in minority photocarrier lifetime within the Region 1, and an increased probability of collection and detection of the majority photocarriers.

Overlying the denuded zone of Region 2 is a compositionally graded surface region (Region 3) having a thickness of approximately 2 micrometers. Region 3 is compositionally graded from a narrow bandgap at the interface B ($Hg_{1-0.22}Cd_{0.22}Te$) to a wider bandgap ($Hg_{1-0.9}Cd_{0.9}Te$) at the radiation receiving surface 20 of the detector 10.

In accordance with a further aspect of this invention the graded composition surface Region 3 acts to both reduce surface recombination states, and the resulting noise, and also to trap or "getter" impurities (C) from the denuded zone of Region 2. The impurities are gettered to a band or zone within the Region 3 wherein x is equal to or greater than approximately 0.4. That is, the impurities C are trapped within a region wherein the semiconductor material has the approximate composition of $Hg_{1-0.4}Cd_{0.4}Te$ or greater. This impurity trapping occurs during fabrication of the detector 10. Impurities that are typically encountered are Si, Na, K, and Li.

The detector 10 may be fabricated by providing the CdZnTe substrate 12 and thereafter forming the epilayer 14 upon a first major surface thereof. Epilayer 14 can be grown by a number of suitable processes including liquid phase epitaxy (LPE), molecular beam epitaxy (MBE), or metal-organic chemical vapor deposition (MOCVD). A presently preferred growth technique is LPE. After the LPE growth is completed the contacts 16 and 18 are applied, such as by sputtering molybdenum onto the HgCdTe material of epilayer 14. If desired, an antireflection coating can be applied to the radiation receiving surface 20.

It should be realized that the dimensions, relative compositions, and other specific details of the detector 10 may be varied while yet achieving the same result. For example, the various thicknesses and relative compositions of Hg and Cd that are detailed above are suitable for detecting LWIR radiation (8 micrometers to 12 micrometers). If it is desired to detect radiation within other spectral bands, then suitable modifications to these thicknesses and relative compositions are made accordingly. Furthermore, it should be realized that the teaching of the invention is not limited for use only with radiation detectors comprised of Group II–VI semiconductor material, and is not limited for use only with detectors of IR radiation. Also, although described in the context of a single photodetector device, it is within the scope of the invention to fabricate linear and two-dimensional arrays of photodetectors that are constructed to exhibit the features described above.

Furthermore, it is within the scope of the invention to fabricate the detector such that the order of the Regions are reversed from that shown in FIG. 1. That is, the radiation receiving surface 20 of Region 3 is adjacent to the substrate 12. In this embodiment, the substrate 12 is selected to be substantially transparent to the wavelengths of interest, and the detector is illuminated through the bottom surface of the substrate in a back-side illuminated configuration.

As such, while the invention has been particularly shown and described with respect to an illustrative embodiment thereof, it will be understood by those skilled in the art that changes in form and details may be made therein without departing from the scope and spirit of the invention.

What is claimed is:

1. A radiation detector comprising:

a substrate having a surface; and a semiconductor body that is disposed upon said surface, said semiconductor body being differentiated into a plurality of regions, said plurality of regions including, a semiconductor region that is compositionally graded through a thickness thereof from a wider bandgap semiconductor material to a narrower bandgap semiconductor material, the wider bandgap semiconductor material being adjacent to said surface of said substrate, wherein a portion of said narrower bandgap semiconductor material is substantially undoped and has a minimal amount of impurities therein, and a surface region overlying said portion of substantially undoped semiconductor material, said surface region being compositionally graded through a thickness thereof from said narrower bandgap semiconductor material to a wider bandgap semiconductor material at a radiation receiving surface of said detector, the compositional grading of said surface region being sufficient to getter impurities from said substantially undoped region and to reduce surface recombination effects.

2. A detector as set forth in claim 1 and further comprising at least first and second electrical contact means disposed upon surfaces of said semiconductor body for coupling said semiconductor body to a source of bias potential.

3. A detector as set forth in claim 2 wherein said source of bias potential establishes a first electric field between said first and second electrical contact means, and wherein said compositionally graded first semiconductor region establishes a second electric field that is perpendicular to said first electric field and oriented for causing photocarriers to enter said substantially undoped portion.

4. A radiation detector comprising:

a substrate having a surface; and a semiconductor body that is disposed upon said surface, said semiconductor body being comprised of a Group II–VI material that is responsive to infrared radiation for generating detectable photocarriers therefrom and being differentiated into a plurality of regions, said plurality of regions including, a semiconductor region that is compositionally graded through a thickness thereof from a wider bandgap semiconductor material to a narrower bandgap semiconductor material, the wider bandgap semiconductor material being adjacent to said surface of said substrate, wherein a portion of said narrower bandgap semiconductor material is substantially undoped and has a minimal amount of impurities therein, and a surface region overlying said portion of substantially undoped semiconductor material, said surface region being compositionally graded through a thickness thereof from said narrower bandgap semiconductor material to a wider bandgap semiconductor material at a radiation receiving surface of said detector.

5. A detector as set forth in claim 4 wherein the compositional grading of said surface region is sufficient to getter impurities from said substantially undoped region and to reduce surface recombination effects.

6. A detector as set forth in claim 4 and further comprising at least first and second electrical contact means disposed upon surfaces of said semiconductor body for coupling said semiconductor body to a source of bias potential.

7. A detector as set forth in claim 6 wherein said source of bias potential establishes a first electric field between said first and second electrical contact means, and wherein said compositionally graded first semiconductor region establishes a second electric field that is perpendicular to said first electric field and oriented for causing photocarriers to enter said substantially undoped portion.

8. A front-side illuminated radiation detector, comprising:

a substrate having a major surface;

an epitaxial layer of HgCdTe formed on said major surface of said substrate, said epitaxial layer having a first surface that is adjacent to said major surface of said substrate and a second surface opposite said first surface, said second surface being a radiation admitting surface, the relative concentrations of Hg and Cd being varied through a thickness of said layer for varying a bandgap of said layer from a wide bandgap, at said first surface, to a narrow bandgap, at a region disposed between said first and said second surfaces, and to a wide bandgap, at said second surface, wherein a first portion of said layer that extends from said first surface functions to absorb admitted radiation and generate detectable charge carriers from said absorbed radiation, and wherein a second portion of said layer that extends from said first portion to said region is a substantially denuded portion, wherein the variation in relative concentrations of the Hg and Cd between said first surface and said region is sufficient to generate a first electric field for injecting minority charge carriers from said first portion into said second portion.

9. A radiation detector as set forth in claim 8 wherein the variation in concentration of the Hg and Cd between said region and said second surface is sufficient to provide a bandgap of sufficient width for reducing surface recombination effects, and also to immobilize impurities that originate from within said substantially denuded second portion.

10. A radiation detector comprising a semiconductor body that is differentiated into a plurality of regions, said plurality of regions including, a semiconductor first region that is compositionally graded from a wider bandgap semiconductor material to a narrower bandgap semiconductor material, wherein a portion of said narrower bandgap semiconductor material is substantially undoped and has a minimal amount of impurities therein; and a second region overlying said portion of substantially undoped semiconductor material, said second region being compositionally graded from said narrower bandgap semiconductor material to a wider bandgap semiconductor material at a radiation receiving surface of said detector, the compositional grading of said second region being sufficient to getter impurities from said substantially undoped region and to reduce surface recombination effects.

11. A detector as set forth in claim 10 and further comprising at least first and second electrical contact means disposed upon surfaces of said semiconductor body for coupling said semiconductor body to a source of bias potential.

12. A detector as set forth in claim 11 wherein said source of bias potential establishes a first electric field between said first and second electrical contact means, and wherein said compositionally graded semiconductor first region establishes a second electric field that is perpendicular to said first electric field and oriented for causing minority photocarriers to enter said substantially undoped portion.

13. A detector as set forth in claim 10 and further including a substrate, and wherein said first region is disposed upon a surface of said substrate.

14. A detector as set forth in claim 10 and further including a substrate comprised of material that is substantially transparent to wavelengths of interest, and wherein said radiation receiving surface of said second region is disposed upon a surface of said substrate.

15. A radiation detector comprising a semiconductor body comprised of a Group II–VI material that is responsive to infrared radiation for generating detectable photocarriers therefrom, said semiconductor body being differentiated into a plurality of regions, said plurality of regions including, a semiconductor first region that is compositionally graded from a wider bandgap semiconductor material to a narrower bandgap semiconductor material, wherein a portion of said narrower bandgap semiconductor material is substantially undoped and has a minimal amount of impurities therein; and a second region overlying said portion of substantially undoped semiconductor material, said second region being compositionally graded from said narrower bandgap semiconductor material to a wider bandgap semiconductor material at a radiation receiving surface of said detector.

16. A detector as set forth in claim 15 wherein the compositional grading of said second region is sufficient to getter impurities from said substantially undoped region and to reduce surface recombination effects.

17. A detector as set forth in claim 15 and further including a substrate, and wherein said first region is disposed upon a surface of said substrate.

18. A detector as set forth in claim 15 and further including a substrate comprised of material that is substantially transparent to wavelengths of interest, and wherein said radiation receiving surface of said second region is disposed upon a surface of said substrate.

* * * * *